(12) United States Patent
Zheng et al.

(10) Patent No.: US 10,755,990 B2
(45) Date of Patent: Aug. 25, 2020

(54) METHOD FOR CHARACTERIZING OHMIC CONTACT ELECTRODE PERFORMANCE OF SEMICONDUCTOR DEVICE

(71) Applicant: XIDIAN UNIVERSITY, Xi'an (CN)

(72) Inventors: Xuefeng Zheng, Xi'an (CN); Xiaohua Ma, Xi'an (CN); Yue Hao, Xi'an (CN); Shuaishuai Dong, Xi'an (CN); Peng Ji, Xi'an (CN); Yingzhe Wang, Xi'an (CN); Zhenling Tang, Xi'an (CN); Chong Wang, Xi'an (CN); Shihui Wang, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 0 days.

(21) Appl. No.: 16/377,188

(22) Filed: Apr. 6, 2019

(65) Prior Publication Data

US 2019/0237369 A1    Aug. 1, 2019

Related U.S. Application Data

(63) Continuation of application No. PCT/CN2018/089988, filed on Jun. 5, 2018.

(30) Foreign Application Priority Data

Jun. 7, 2017 (CN) .......................... 2017 1 0422163

(51) Int. Cl.
*H01L 21/28* (2006.01)
*H01L 21/66* (2006.01)
(Continued)

(52) U.S. Cl.
CPC ............ *H01L 22/14* (2013.01); *G01R 27/205* (2013.01); *H01L 21/26546* (2013.01);
(Continued)

(58) Field of Classification Search
CPC ....... H01L 22/14; H01L 22/34; H01L 21/283; H01L 21/26546; H01L 21/3245;
(Continued)

(56) References Cited

U.S. PATENT DOCUMENTS

2006/0097741 A1* 5/2006 Payman ................. G01R 31/70
324/762.03
2014/0055142 A1* 2/2014 Klapper ............... G01R 27/205
324/421
(Continued)

FOREIGN PATENT DOCUMENTS

CN       102074550 A  *  5/2011
CN       102074550 A  *  5/2011
JP       2006352035 A  *  12/2006

*Primary Examiner* — Charles D Garber
*Assistant Examiner* — S M Sohel Imtiaz
(74) *Attorney, Agent, or Firm* — Hemisphere Law, PLLC; Zhigang Ma (57) ABSTRACT

The present disclosure provides a method for characterizing ohmic contact electrode performance of a semiconductor device. The method comprises: preparing two sets of testing patterns on a semiconductor device; testing resistance values of the two sets of testing patterns respectively; calculating a sheet resistance of an ohmic contact area according to the obtained resistance values; and evaluating the ohmic contact electrode performance of the semiconductor device according to the sheet resistance of the ohmic contact electrode.

5 Claims, 4 Drawing Sheets (51) Int. Cl.
*H01L 21/283* (2006.01)
*H01L 21/265* (2006.01)
*H01L 21/324* (2006.01)
*H01L 29/40* (2006.01)
*H01L 29/66* (2006.01)
*G01R 27/20* (2006.01)
*H01L 29/417* (2006.01)
*H01L 29/778* (2006.01)

(52) U.S. Cl.
CPC ........ *H01L 21/283* (2013.01); *H01L 21/3245* (2013.01); *H01L 22/34* (2013.01); *H01L 29/401* (2013.01); *H01L 29/41758* (2013.01); *H01L 29/66462* (2013.01); *H01L 29/778* (2013.01)

(58) Field of Classification Search
CPC ............. H01L 29/401; H01L 29/66462; H01L 29/41758; H01L 29/778; H01L 21/28575; H01L 29/2003; G01R 27/205
See application file for complete search history.

(56) References Cited

U.S. PATENT DOCUMENTS

| | | | |
|---|---|---|---|
| 2014/0065529 A1* | 3/2014 | Fujii | G03G 5/047 430/56 |
| 2014/0264281 A1* | 9/2014 | Niyogi | H01L 21/02205 257/29 |
| 2019/0256897 A1* | 8/2019 | Lal | C12Q 1/68 |

* cited by examiner

METHOD FOR CHARACTERIZING OHMIC CONTACT ELECTRODE PERFORMANCE OF SEMICONDUCTOR DEVICE

FIELD OF THE DISCLOSURE

The disclosure relates to the field of semiconductor device, and more particularly to a method for characterizing ohmic contact electrode performance of a semiconductor device.

BACKGROUND

The wide bandgap semiconductor materials represented by GaN have many advantages. It is a new type of semiconductor materials which have developed rapidly after the first generation of semiconductor materials represented by silicon (Si) and the second generation of semiconductor materials represented by GaAs. Gallium nitride material has superior physical properties, such as high electron drift velocity, wide bandgap, high thermal conductivity, high pressure resistance, high temperature resistance, radiation resistance, etc. Therefore, it is widely used in high-temperature and high-power devices, optoelectronics and high-frequency microwave devices, and has a large market. Due to the superior electrical performance of AlGaN/GaN HEMT devices and MIS-HEMT devices, they are considered to be the most promising candidates for high-voltage power switches. In recent years, related devices have become an international research hotspot.

In the manufacture process of the semiconductor devices such as GaN, the manufacture of ohmic electrodes is a critical step. To manufacture high-performance GaAs and GaN devices, good ohmic contact is particularly important. If the ohmic contact resistance is too large, the source and drain power dissipation will increase, and the output power and efficiency of the device will be affected. The ohmic contact resistance is an important indicator for judging the ohmic contact quality, and an accurate test of the sheet resistance of the ohmic contact area is the key to calculating the ohmic contact resistance. Therefore, the selection of a suitable method for accurately testing the sheet resistance of the ohmic contact area plays a very important role in the development and evaluation of the device.

Currently, the most common method for measuring ohmic contact resistance is the rectangular transmission line model (TLM) method and the circular transmission line model (CTLM) method.

The rectangular transmission line model (TLM) method is mainly to design a set of rectangular electrode testing patterns with unequal spacing, perform experimental tests, and combine the mathematical calculation, thereby to obtain a value of an active area sheet resistance, then to approximate the active area sheet resistance value $R_{sh}$ as an ohmic area sheet resistance value $R_{shc}$. The method has the following drawbacks: firstly, since the ohmic contact area is formed by a complicated process including metal deposition, ion implantation or high temperature annealing on the active area, the sheet resistance of the active area and the ohmic contact area are not equal, even very different, and cannot be approximated; in addition, the rectangular transmission line patterns themselves need to be mesa-etched at the time of manufacture, which has an edge leakage effect, so the use of this model will make the final measurement result inaccurate.

The circular transmission line model (CTLM) method includes a circular dot transmission line model (CDTLM) method and a circular ring transmission line model (CRTLM) method. The CDTLM method is mainly to design multiple sets of circular dot electrode testing patterns, perform experimental tests and simple curve fitting, thereby to obtain the values of the active area resistance and the ohmic area sheet resistance. Compared with the rectangular transmission line model (TLM) method, the accuracy of this method is improved, but the required testing patterns generally need more than 5 sets, so the test sample has a large area. The CRTLM method is mainly to design three sets of circular ring testing patterns, perform experimental tests and complicated mathematical calculations, thereby to obtain a value of ohmic area sheet resistance. This method has the following drawbacks: first, the CTLM method ignores the sheet resistance of the metal layer during measurement, which will cause a certain calculation error; secondly, the formula for calculating the sheet resistance of the ohmic area is complicated, and the computer software-assisted simulation is needed to solve the Bessel function, which is computationally intensive, resulting in a longer total time for testing and computational analysis.

With the further development of semiconductor devices, the original measurement method for the sheet resistance of the ohmic contact area is more and more difficult to adapt to the requirements of high-performance semiconductor device development. Therefore, it is especially important to correct the original ohmic contact resistance measurement method.

SUMMARY

In order to solve the above problems existing in the prior art, the disclosure provides a method for characterizing ohmic contact electrode performance of a semiconductor device. The technical problem to be solved by the disclosure is achieved by the following technical solutions.

The present disclosure provides a method for characterizing ohmic contact electrode performance of a semiconductor device, comprising:

preparing two sets of testing patterns on a semiconductor device waited to be evaluated; testing resistance values of the two sets of testing patterns respectively;

calculating a sheet resistance of an ohmic contact area according to the obtained resistance values; and evaluating the ohmic contact electrode performance of the semiconductor device according to the sheet resistance of the ohmic contact area.

In one embodiment, the step of preparing two sets of testing patterns on a semiconductor device waited to be characterized comprises:

preparing the two sets of testing patterns on a semiconductor material of the semiconductor device for measuring the sheet resistance of the ohmic contact area, wherein the two sets of testing patterns comprise:

a first set of testing patterns, comprising a central contacted circular ohmic electrode A1, a concentric first annular ohmic electrode A2, and a concentric second annular ohmic electrode A3; and a second set of testing patterns, comprising a central contacted circular ohmic electrode B1, a concentric first annular ohmic electrode B2, and a concentric second annular ohmic electrode B3.

In one embodiment, the two sets of testing patterns are prepared by depositing metal electrodes or performing ion implantation on the semiconductor material, and then performing a high temperature annealing.

In one embodiment, the circular ohmic electrode A1 has the same radius as the circular ohmic electrode B1, and the second annular ohmic electrode A3 has the same radius as the second annular ohmic electrode B3.

In one embodiment, the step of testing resistance values of the two sets of testing patterns respectively comprises:

measuring a resistance value $R_{L1}$ between the circular ohmic electrode A1 and the second annular ohmic electrode A3 by a semiconductor parameter analyzer; and measuring a resistance value $R_{L2}$ between the circular ohmic electrode B1 and the second annular ohmic electrode B3 by the semiconductor parameter analyzer.

In one embodiment, the step of measuring a resistance value $R_{L1}$ between the circular ohmic electrode A1 and the second annular ohmic electrode A3 by a semiconductor parameter analyzer comprises:

applying a bias voltage $V_1$ between the circular ohmic electrode A1 and the second annular ohmic electrode A3 by the semiconductor parameter analyzer, connecting an ammeter in series between the circular ohmic electrode A1 and the second annular ohmic electrode A3, reading a value $I_1$ of the ammeter, and calculating the resistance value $R_{L1}$ between the circular ohmic electrode A1 and the second annular ohmic electrode A3 through the Ohm's law.

In one embodiment, the step of measuring a resistance value $R_{L2}$ between the circular ohmic electrode B1 and the second annular ohmic electrode B3 by the semiconductor parameter analyzer comprises:

applying a bias voltage $V_2$ between the circular ohmic electrode B1 and the second annular ohmic electrode B3 by the semiconductor parameter analyzer, connecting an ammeter in series between the circular ohmic electrode B1 and the second annular ohmic electrode B3, reading a value $I_2$ of the ammeter, and calculating the resistance value $R_{L2}$ between the circular ohmic electrode B1 and the second annular ohmic electrode B3 through the Ohm's law.

In one embodiment, the step of calculating a sheet resistance of an ohmic contact area according to the obtained resistance values comprises:

constructing a correction formula for correcting the sheet resistance of the ohmic contact area according to the resistance value $R_{L1}$ and the resistance value $R_{L2}$, wherein the correction formula is represented as:

$$R_{shc} = R_{sh} - \frac{2\pi(R_{L2} - R_{L1})}{\ln\frac{r'_2 r'_3}{r_2 r_3}},$$

where $R_{shc}$ refers to the sheet resistance of the ohmic contact area to be solved, $R_{sh}$ refers to an active area resistance, $r_1$ refers to a radius of the circular ohmic electrode A1 or a radius of the circular ohmic electrode B1; $r_2$ and $r_3$ respectively refer to an inner radius and an outer radius of the first annular ohmic electrode A2; $r'_2$ and $r'_3$ respectively refer to an inner radius and an outer radius of the first annular ohmic electrode B2.

In one embodiment, the step of constructing a formula for correcting the sheet resistance of the ohmic contact area according to the resistance value $R_{L1}$ and the resistance value $R_{L2}$ comprises:

expressing the resistance value $R_{L1}$ as a first expression of $R_{L1}$: $R_{L1} = R_{A1} + R_{A12} + R_{A2} + R_{A23} + R_{A3}$; where $R_{A1}$ refers to a resistance value of the ohmic contact area under the circular ohmic electrode A1, $R_{A12}$ refers to a resistance value of an active area between the circular ohmic electrode A1 and the first annular ohmic electrode A2, $R_{A2}$ refers to a resistance value of the ohmic contact area under the first annular ohmic electrode A2, $R_{A23}$ refers to a resistance value of an active area between the first annular ohmic electrode A2 and the second annular ohmic electrode A3, and $R_{A3}$ refers to a resistance value of the ohmic contact area under the second annular ohmic electrode A3;

expressing the resistance value $R_{L2}$ as a first expression of $R_{L2}$: $R_{L2} = R_{B1} + R_{B12} + R_{B2} + R_{B23} + R_{B3}$; where $R_{B1}$ refers to a resistance value of the ohmic contact area under the circular ohmic electrode B1, $R_{B12}$ refers to a resistance value of an active area between the circular ohmic electrode B1 and the first annular ohmic electrode B2, $R_{B2}$ refers to a resistance value of the ohmic contact area under the first annular ohmic electrode B2, $R_{B23}$ refers to a resistance value of an active area between the first annular ohmic electrode B2 and the second annular ohmic electrode B3, and $R_{B3}$ refers to a resistance value of the ohmic contact area under the second annular ohmic electrode B3;

obtaining a second expression of $R_{L2}$ from the first expression of $R_{L2}$ according to $R_{A1} = R_{B1}$ and $R_{A3} = R_{B3}$, the second expression of $R_{L2}$ being represented as $R_{L2} = R_{A1} + R_{B12} + R_{B2} + R_{B23} + R_{A3}$; calculating the resistance value $R_{A2}$ and the resistance value $R_{B2}$ respectively:

$$R_{A2} = \int_{r_2}^{r_3} \frac{R_{shc}}{2\pi x} dx = \frac{R_{shc}}{2\pi} \ln\left(\frac{r_3}{r_2}\right),$$

$$R_{B2} = \int_{r'_2}^{r'_3} \frac{R_{shc}}{2\pi x} dx = \frac{R_{shc}}{2\pi} \ln\left(\frac{r'_3}{r'_2}\right);$$

calculating the resistance value $R_{A12}$ and the resistance value $R_{B12}$ respectively:

$$R_{A12} = \int_{r_1}^{r_2} \frac{R_{sh}}{2\pi x} dx = \frac{R_{sh}}{2\pi} \ln\left(\frac{r_2}{r_1}\right),$$

$$R_{B12} = \int_{r_1}^{r'_2} \frac{R_{sh}}{2\pi x} dx = \frac{R_{sh}}{2\pi} \ln\left(\frac{r'_2}{r_1}\right);$$

calculating the resistance value $R_{A23}$ and the resistance value $R_{B23}$ respectively:

$$R_{A23} = \int_{r_3}^{r_4} \frac{R_{sh}}{2\pi x} dx = \frac{R_{sh}}{2\pi} \ln\left(\frac{r_4}{r_3}\right),$$

$$R_{B23} = \int_{r'_3}^{r_4} \frac{R_{sh}}{2\pi x} dx = \frac{R_{sh}}{2\pi} \ln\left(\frac{r_4}{r'_3}\right);$$

substituting the expressions of $R_{A2}$, $R_{A12}$, and $R_{A23}$ into the first expression of $R_{L1}$, and obtaining a second expression of $R_{L1}$ as follows:

$$R_{L1} = R_{A1} + \frac{R_{sh}}{2\pi} \ln\frac{r_2}{r_1} + \frac{R_{shc}}{2\pi} \ln\frac{r_3}{r_2} + \frac{R_{sh}}{2\pi} \ln\frac{r_4}{r'_3} + R_{A3};$$

substituting the expressions of $R_{B2}$, $R_{B12}$, and $R_{B23}$ into the first expression of $R_{L2}$, and obtaining a third expression of $R_{L2}$ as follows:

$$R_{L2} = R_{A1} + \frac{R_{sh}}{2\pi} \ln\frac{r'_2}{r'_1} + \frac{R_{shc}}{2\pi} \ln\frac{r'_3}{r'_2} + \frac{R_{sh}}{2\pi} \ln\frac{r_4}{r'_3} + R_{A3};$$

and obtaining the correction formula by subtracting the second expression of $R_{L1}$ from the third expression of $R_{L2}$.

Compared with the prior art, the present disclosure has the following beneficial effects.

The present disclosure proposes a correction formula of the ohmic contact area sheet resistance $R_{shc}$ by designing two sets of testing patterns and carrying out a simple mathematical derivation, and corrects the ohmic contact area sheet resistance $R_{shc}$ based on the active area sheet resistance $R_{sh}$, thereby solving the problem that the active area sheet resistance $R_{sh}$ is approximately replaced by the ohmic contact area sheet resistance $R_{shc}$ in the existing rectangular transmission line model TLM, which results in a large test error. The disclosure realizes an accurate calculation of $R_{shc}$, thereby enabling more accurate characterization of the ohmic electrode of the semiconductor device.

Further, the method of the present disclosure does not need to carry out mass isolation for the testing patterns, solves the problem of the edge leakage effect caused by the rectangular transmission line model TLM mesa isolation, reduces the test error, and further improves the test accuracy and the characterization accuracy of ohmic electrode performance.

Further, the method of the present disclosure only needs to electrically measure two sets of testing patterns by using a semiconductor parameter tester. The ohmic contact area sheet resistance $R_{shc}$ is corrected by a simple correction formula of the ohmic contact area sheet resistance $R_{shc}$, and the complex mathematical calculation of traditional circular transmission line model CTLM method is simplified. Also it does not need to use computer-aided simulation to solve the Bessel function, and achieves the purpose of quickly and accurately characterizing the ohmic electrode performance.

Further, the method of the present disclosure only needs two sets of testing patterns, which can reduce the area of the sample. And the testing patterns are manufactured on the basis of a conventional device process, the process technology is simple and stable, and the test method is fast and convenient.

Further, the method of present disclosure can be widely applied to the characterization of ohmic contact electrodes formed by all metal-semiconductor materials, and the measured ohmic contact area sheet resistance can be used for process optimization, performance evaluation, and reliability analysis of semiconductor devices.

Further, the method of the present disclosure can simplify the calculation complexity of the ohmic contact area sheet resistance, improve the calculation accuracy of the ohmic contact area sheet resistance $R_{shc}$ by the conventional transmission line model method, and then realize process optimization and reliability evaluation of GaAs, GaN, $GaO_2$ and other microelectronic devices, as well as realize manufacture, performance evaluation and reliability analysis of high electron mobility heterojunction transistor HEMT.

It will be understood that within the scope of the present invention, the above various technical features of the disclosure and the technical features specifically described below (as in the embodiments and examples) may be combined with each other to constitute a new or preferred technical solution. Due to space limitations, we will not repeat them here.

DETAILED DESCRIPTION OF PREFERRED EMBODIMENTS

In the following description, technical details are set forth in order to provide the reader with a better understanding of the present disclosure. However, those skilled in the art can understand that the technical solutions claimed in the present application can be implemented without these technical details and various changes and modifications based on the following embodiments.

The specific embodiments of the present disclosure will be further described in detail below with reference to the drawings and embodiments. The following examples are intended to illustrate the invention but are not intended to limit the scope of the disclosure.

Figure 1:
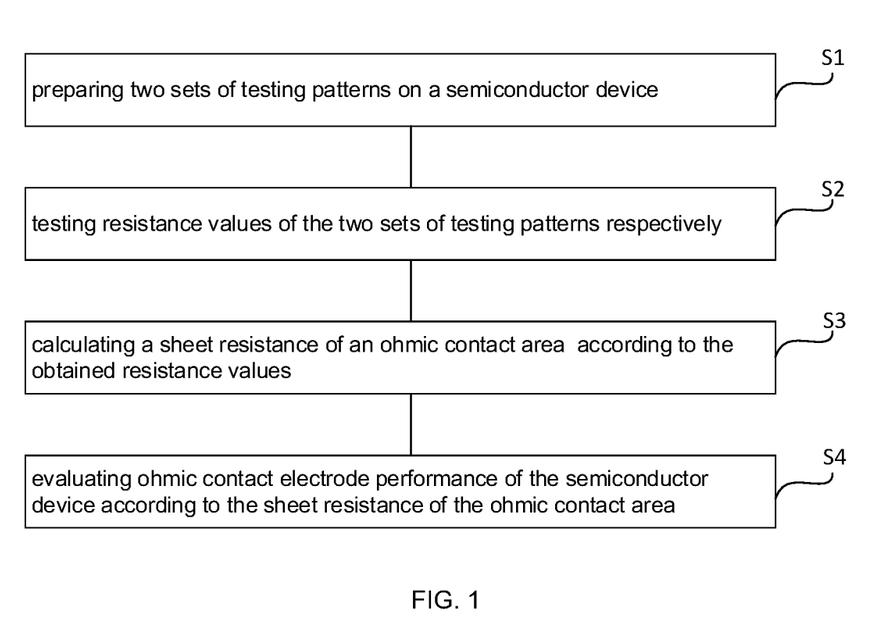
FIG. 1 is a flow chart of a method for characterizing ohmic contact electrode performance of a semiconductor device according to an embodiment of the present disclosure.

Please refer to FIG. 1, FIG. 1 is a flow chart of a method for characterizing ohmic contact electrode performance of a semiconductor device according to an embodiment of the present disclosure. The method of this embodiment includes:

S1: preparing two sets of testing patterns on a semiconductor device;

S2: testing resistance values of the two sets of testing patterns respectively;

S3: calculating a sheet resistance of an ohmic contact area according to the obtained resistance values;

S4: evaluating the ohmic contact electrode performance of the semiconductor device according to the sheet resistance of the ohmic contact area.

Specifically, in this method, the step of S1 includes: fabricating two sets of testing patterns on a semiconductor material of the semiconductor device for measuring the ohmic contact area sheet resistance. The two sets of testing patterns include a first set of testing patterns and a second set of testing patterns. The first set of testing patterns includes a central contacted circular ohmic electrode A1, a concentric first annular ohmic electrode A2, and a concentric second annular ohmic electrode A3. The second set of testing patterns includes a central contacted circular ohmic electrode B1, a concentric first annular ohmic electrode B2, and a concentric second annular ohmic electrode B3.

In an embodiment of the present application, the two sets of testing patterns are prepared by depositing metal electrodes on the semiconductor material, or prepared by performing ion implantation and then high temperature annealing. Preferably, the testing patterns are fabricated on a heterojunction structure, but are not limited thereto.

Figure 7:
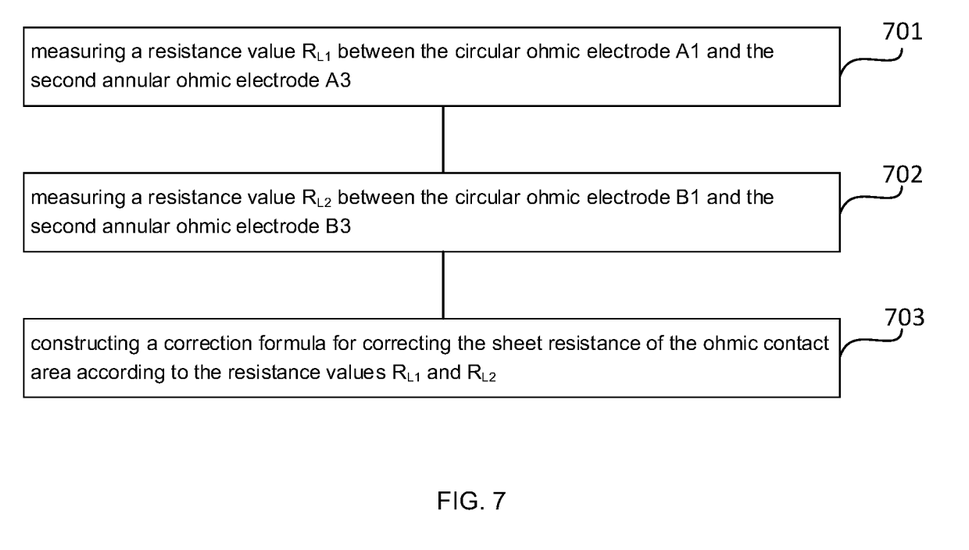
FIG. 7 is a flow chart showing processes of testing and calculating a sheet resistance of an ohmic contact area according to an embodiment of the present disclosure.

Please refer to FIG. 7, FIG. 7 is a flow chart showing testing and calculating processes of the sheet resistance of the ohmic contact area according to an embodiment of the present disclosure. The testing and calculating processes include the following steps.

Step 701: a resistance value $R_{L1}$ between the circular ohmic electrode A1 and the second annular ohmic electrode A3 is calculated.

Thereafter, step 702: a resistance value $R_{L2}$ between the circular ohmic electrode B1 and the second annular ohmic electrode B3 is calculated.

Thereafter, step 703: a correction formula for correcting the sheet resistance of the ohmic contact area according to the resistance value $R_{L1}$ and the resistance value $R_{L2}$ is constructed. The correction formula for correcting the sheet resistance of the ohmic contact area is represented as:

$$R_{shc} = R_{sh} - \frac{2\pi(R_{L2} - R_{L1})}{\ln\frac{r'_2 r'_3}{r_2 r_3}},$$

where $R_{shc}$ is an ohmic contact area sheet resistance to be solved, $R_{sh}$ is an active area resistance, $r_1$ is a radius of the circular ohmic electrode A1 which is equal to a radius of the circular ohmic electrode B1; $r_2$ and $r_3$ respectively refer to an inner radius and an outer radius of the first annular ohmic electrode A2; $r'_2$ and $r'_3$ respectively refer to an inner radius and an outer radius of the first annular ohmic electrode B2.

In an embodiment of the present application, constructing a correction formula for correcting the sheet resistance of the ohmic contact area includes the following steps.

The resistance value $R_{L1}$ is expressed as a first expression of $R_{L1}$: $R_{L1}=R_{A1}+R_{A12}\pm R_{A2}+R_{A23}\pm R_{A3}$, where $R_{A1}$ is a resistance value of the ohmic contact area under the circular ohmic electrode A1, $R_{A12}$ is a resistance value of an active area between the circular ohmic electrode A1 and the first annular ohmic electrode A2, $R_{A2}$ is a resistance value of an ohmic contact area under the annular ring ohmic electrode A2, $R_{A23}$ is a resistance value of an active area between the first annular ohmic electrode A2 and the second annular ohmic electrode A3, and $R_{A3}$ is a resistance value of an ohmic contact area under the second annular ohmic electrode A3.

The resistance value $R_{L2}$ is expressed as a first expression of $R_{L2}$: $R_{L2}=R_{B1}+R_{B12}\pm R_{B2}+R_{B23}\pm R_{B3}$, where $R_{B1}$ is a resistance value of the ohmic contact area under the circular ohmic electrode B1, $R_{B12}$ is a resistance value of an active area between the circular ohmic electrode B1 and the first annular ohmic electrode B2, $R_{B2}$ is a resistance value of an ohmic contact area under the first annular ohmic electrode B2, $R_{B23}$ is a resistance value of an active area between the first annular ohmic electrode B2 and the second annular ohmic electrode B3, and $R_{B3}$ is a resistance value of an ohmic contact area under the second annular ohmic electrode B3.

According to $R_{A1}=R_{B1}$ and $R_{A3}=R_{B3}$, a second expression of $R_{L2}$ is obtained from the first expression of $R_{L2}$, and the second expression of $R_{L2}$ is represented as $R_{L2}=R_{A1}+R_{B12}\pm R_{B2}+R_{B23}+R_{A3}$.

The resistance value $R_{A2}$ and the resistance value $R_{B2}$ are respectively calculated as:

$$R_{A2} = \int_{r_2}^{r_3} \frac{R_{shc}}{2\pi x}dx = \frac{R_{shc}}{2\pi x}\ln\left(\frac{r_3}{r_2}\right),$$

$$R_{B2} = \int_{r'_2}^{r'_3} \frac{R_{shc}}{2\pi x}dx = \frac{R_{shc}}{2\pi x}\ln\left(\frac{r'_3}{r'_2}\right).$$

The resistance value $R_{A12}$ and the resistance value $R_{B12}$ are respectively calculated as:

$$R_{A12} = \int_{r_1}^{r_2} \frac{R_{sh}}{2\pi x}dx = \frac{R_{sh}}{2\pi}\ln\left(\frac{r_2}{r_1}\right),$$

$$R_{B12} = \int_{r_1}^{r'_2} \frac{R_{sh}}{2\pi x}dx = \frac{R_{sh}}{2\pi}\ln\left(\frac{r'_2}{r_1}\right).$$

The resistance value $R_{A23}$ and the resistance value $R_{B23}$ are respectively calculated as:

$$R_{A23} = \int_{r_3}^{r_4} \frac{R_{sh}}{2\pi x}dx = \frac{R_{sh}}{2\pi}\ln\left(\frac{r_4}{r_3}\right),$$

$$R_{B23} = \int_{r'_3}^{r_4} \frac{R_{sh}}{2\pi x}dx = \frac{R_{sh}}{2\pi}\ln\left(\frac{r_4}{r'_3}\right).$$

The expressions of $R_{A2}$, $R_{A12}$, and $R_{A23}$ are brought into the first expression of $R_{L1}$, and then a third expression of $R_{L1}$ is obtained as follows:

$$R_{L1} = R_{A1} + \frac{R_{sh}}{2\pi}\ln\frac{r_2}{r_1} + \frac{R_{shc}}{2\pi}\ln\frac{r_3}{r_2} + \frac{R_{sh}}{2\pi}\ln\frac{r_4}{r_3} + R_{A3}.$$

The expressions of $R_{B2}$, $R_{B12}$, and $R_{B23}$ are brought into the first expression of $R_{L2}$, and then a second expression of $R_{L2}$ is obtained as follows:

$$R_{L2} = R_{A1} + \frac{R_{sh}}{2\pi}\ln\frac{r'_2}{r'_1} + \frac{R_{shc}}{2\pi}\ln\frac{r'_3}{r'_2} + \frac{R_{sh}}{2\pi}\ln\frac{r_4}{r'_3} + R_{A3}.$$

The difference between the third expression of $R_{L2}$ and the second expression of $R_{L1}$ is calculated and thereby the correction formula is obtained as:

$$R_{shc} = R_{sh} - \frac{2\pi(R_{L2} - R_{L1})}{\ln\frac{r'_2 r'_3}{r_2 r_3}}.$$

In one embodiment, calculating the resistance value $R_{L1}$ between the circular ohmic electrode A1 and the second annular ohmic electrode A3 includes the following steps.

A bias voltage $V_1$ is applied between the circular ohmic electrode A1 and the second annular ohmic electrode A3 by the semiconductor parameter analyzer, and an ammeter is connected between the circular ohmic electrode B1 and the second annular ohmic electrode B3, a value $I_1$ of the ammeter is read, and a resistance value $R_{L1}$ between the circular ohmic electrode A1 and the second annular ohmic electrode A3 is calculated by the Ohm's law.

In one embodiment, calculating the resistance value $R_{L2}$ between the circular ohmic electrode B1 and the second annular ohmic electrode B3 includes the following steps.

A bias voltage $V_2$ is applied between the circular ohmic electrode B1 and the second annular ohmic electrode B3 by the semiconductor parameter analyzer, and an ammeter is connected between the circular ohmic electrode B1 and the second annular ohmic electrode B3, a value $I_2$ of the ammeter is read, and a resistance value $R_{L2}$ between the circular ohmic electrode B1 and the second annular ohmic electrode B3 is calculated by the Ohm's law.

In one embodiment, the circular ohmic electrode A1 has the same radius as the circular ohmic electrode B1, and the second annular ohmic electrode A3 has the same radius as the second annular ohmic electrode B3, that is, the resistance relationship of each part of the two sets of ohmic contact testing patterns is: $R_{A1}=R_{B1}$, $R_{A3}=R_{B3}$.

In one embodiment of the present application, a method for characterizing ohmic contact electrode performance of a semiconductor device includes the following steps.

Step 101: ohmic contact area sheet resistance testing patterns are fabricated on the heterojunction structure.

1a) A substrate layer, an intrinsic buffer layer, and a barrier layer are sequentially grown from bottom to top on a substrate using a heterojunction epitaxial growth method, wherein the substrate commonly used is sapphire, Si, SiC, diamond material, and the buffer layer commonly used is GaN, GaAs III-V materials, the barrier layer commonly used is AlGaN, InGaN, AlInGaN materials. Alternatively, a semiconductor thin film material such as $GaO_2$ may be directly grown on the substrate material to form the ohmic contact region sheet resistance testing patterns.

Figure 2:
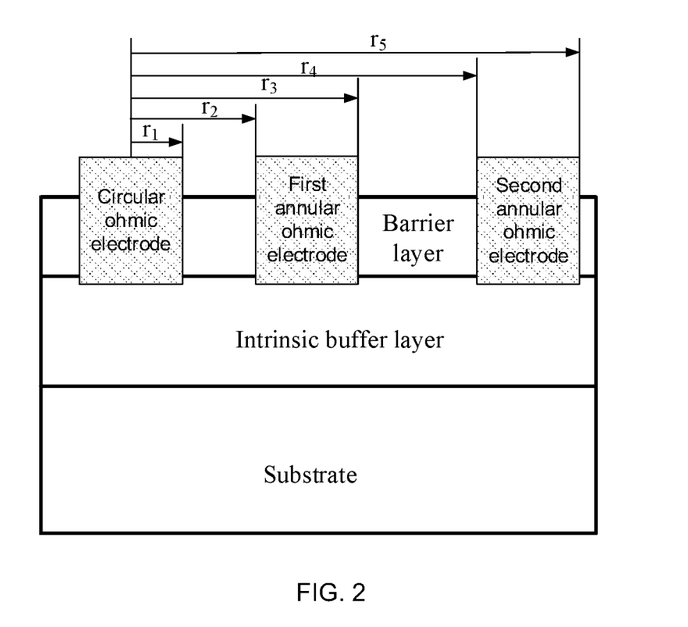
FIG. 2 is a schematic structural view of a set of testing patterns according to an embodiment of the present disclosure.
Figure 3:
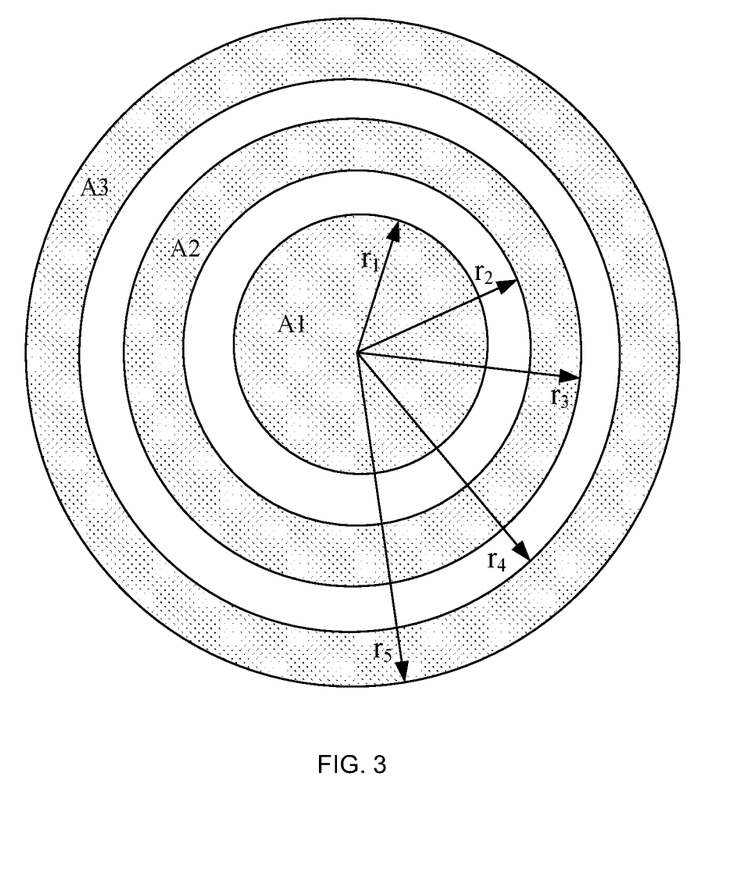
FIG. 3 is a schematic top view of a first set of testing patterns according to an embodiment of the present disclosure.
Figure 4:
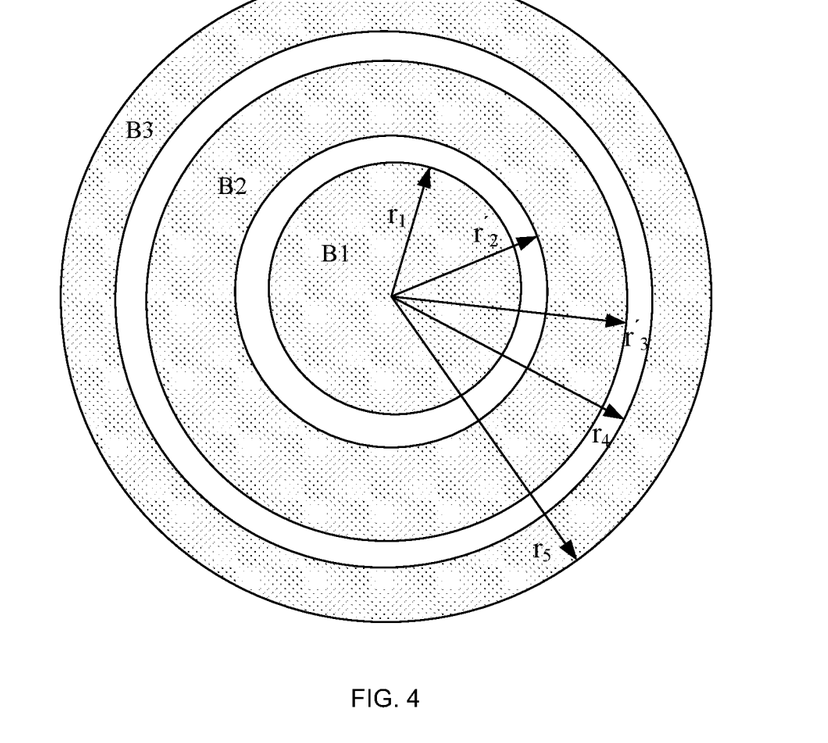
FIG. 4 is a schematic top view of a second set of testing patterns according to an embodiment of the present disclosure.

1b) A metal electrode is deposited on the barrier layer or an ion implantation is performed on the barrier layer, and then two sets of circular ohmic contact testing patterns are formed on the hetero-epitaxial structure which formed by the barrier layer and the buffer layer via a high temperature annealing process, wherein a first set of concentric circular testing patterns is shown in FIG. 3, and a second set of concentric circular testing patterns is shown in FIG. 4, the schematic structure of the testing patterns is shown in FIG. 2. Referring to FIG. 3, the first set of testing patterns includes three different ohmic electrodes: one circular ohmic electrode A1 and two concentric annular ohmic electrodes, namely a first annular ohmic electrode A2 and a second annular ohmic electrode A3 respectively. The length of each ohmic electrode is reasonably set by a tester according to the usual length range and test requirements in the metal electrode deposition process. The following is just an example provided, but the disclosure is not limited thereto. For example, a radius of the circular ohmic electrode A1 in the first set of testing patterns is $r_1=90$ an inner diameter of the first annular ohmic electrode A2 is $r_2=100$ an outer diameter of the first annular ohmic electrode A2 is $r_3=130$ μm; an inner diameter of the second annular ohmic electrode A3 is $r_4=140$ μm, and an outer diameter the second annular ohmic electrode A3 is $r_5=160$ μm.

Referring to FIG. 4, the second set of circular testing patterns includes three different ohmic electrodes: one circular ohmic electrode B1 and two concentric annular ohmic electrodes, namely a first annular ohmic electrode B2 and a second annular ohmic electrode B3. The length of each ohmic electrode is reasonably set by a tester according to the usual length range and test requirements in the metal electrode deposition process. The example is provided, but not limited to that a radius of the circular ohmic electrode B1 in the second set of circular testing patterns is $r_1=90$ an inner diameter of the first annular ohmic electrode B2 is $r'_2=95$ an outer diameter of the first annular ohmic electrode B2 is $r'_3=135$ an inner diameter of the second annular ohmic electrode B3 is $r_4=140$ and an outer diameter of the second annular ohmic electrode B3 is $r_5=160$ μm.

It should be noted that the testing patterns can be fabricated on any semiconductor device having ohmic contact area and active area, for example, a HEMT device based on an III-V semiconductor material such as GaN or GaAs, or the semiconductor devices such as CMOS and field effect transistors, for evaluating the performance of the semiconductor devices.

Step 102: a total resistance of the first set and the second set of testing patterns are measured respectively.

Figure 5:
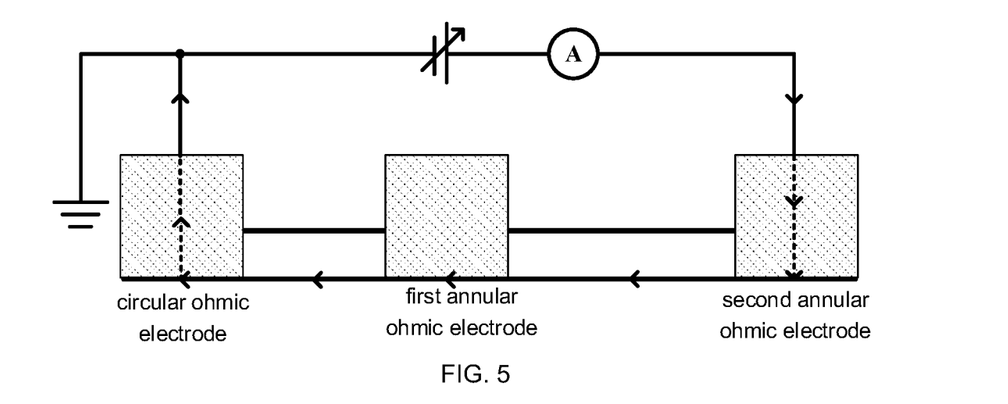
FIG. 5 is a circuit schematic diagram showing a principle of testing resistance values according to an embodiment of the present disclosure.

Referring to the resistance testing schematic diagram shown in FIG. 5, testing steps of the total resistance between the circular ohmic electrode and the second annular ohmic electrode of each set of testing patterns are as follows.

2a) A bias voltage $V_1$ is applied between the circular ohmic electrode A1 and the second annular ohmic electrode A3 of the first set of circular testing patterns, and an ammeter is connected in series in the loop, a value $I_1$ of the ammeter is read, and a resistance value $R_{L1}$ between the circular ohmic electrode A1 and the second annular ohmic electrode A3 is calculated by the Ohm's law:

$$R_{L1}=V_1/I_1.$$

2b) A bias voltage $V_2$ is applied between the circular ohmic electrode B1 and the second annular ohmic electrode B3 of the second set of circular testing patterns, and an ammeter is connected in series in the loop, a value $I_2$ of the ammeter is read, and a resistance value $R_{L2}$ between the circular ohmic electrode B1 and the second annular ohmic electrode B3 is calculated by the Ohm's law:

$$R_{L2}=V_2/I_2.$$

Step 103: a correction formula of the ohmic contact area sheet resistance $R_{shc}$ in the testing patterns is constructed.

3a) Taking the testing patterns in the present disclosure as an example, according to FIG. 3, the resistance value $R_{L1}$ between the circular ohmic electrode A1 and the second annular ohmic electrode A3 in the first set of circular testing patterns is expressed as:

$$R_{L1}=R_{A1}+R_{A12}+R_{A2}+R_{A23}+R_{A3},$$

where $R_{A1}$ is a resistance value of the ohmic contact area of the circular ohmic electrode A1 in the first set of circular testing patterns; $R_{A12}$ is a resistance value of the active area between the circular ohmic electrode A1 and the first annular ohmic electrode A2 in the first set of circular testing patterns; $R_{A2}$ is a resistance value of the ohmic contact area of the first annular ohmic electrode A2 in the first set of circular testing patterns; $R_{A23}$ is a resistance value of the active area between the first annular ohmic electrode A2 and the second annular ohmic electrode A3 in the first set of circular testing patterns, and $R_{A3}$ is a resistance value of the ohmic contact area under the second annular ohmic electrode A3 in the first set of circular testing patterns.

3b) Taking the testing patterns in the present disclosure as an example, according to FIG. 4, the resistance value $R_{L2}$ between the circular ohmic electrode B1 and the second annular ohmic electrode B3 in the second set of circular testing patterns is expressed as:

$$R_{L2}=R_{B1}+R_{B12}+R_{B2}+R_{B23}+R_{B3},$$

where $R_{B1}$ is a resistance value of the ohmic contact area of the circular ohmic electrode B1 in the second set of circular testing patterns; $R_{B12}$ is a resistance value of the active area between the circular ohmic electrode B1 and the first annular ohmic electrode B2 in the second set of circular testing patterns; $R_{B2}$ is a resistance of the ohmic contact area of the first annular ohmic electrode B2 in the second set of circular testing patterns; $R_{B23}$ is a resistance value of the active area between the first annular ohmic electrode B2 and the second annular ohmic electrode B3 in the second set of circular testing patterns; $R_{B3}$ is a resistance value of the ohmic contact area of the second annular ohmic electrode B3 in the second set of circular testing patterns.

3c) According to the relationships that the circular ohmic electrode A1 of the first set of testing patterns and the circular ohmic electrode B1 of the second set of testing patterns have the same radius, and the second annular ohmic electrodes A3 and B3 have the same radius, the resistance relationship of each part in the two sets of ohmic contact testing patterns are obtained: $R_{A1}=R_{B1}$, $R_{A3}=R_{B3}$, and then the expression of the resistance value $R_{L2}$ between the circular ohmic electrode B1 and the second annular ohmic electrode B3 of the second set of ohmic contact testing patterns in step 3b) is transformed into:

$$R_{L2}=R_{A1}+R_{B12}+R_{B2}+R_{B23}+R_{A3}$$

3d) The resistance value $R_{A2}$ of the contact area under the first annular ohmic electrode A2 in the first set of ohmic contact testing patterns and the resistance value $R_{B2}$ of contact area under the first annular ohmic electrode B2 in the second set of ohmic contact testing patterns are respectively calculated as follows:

$$R_{A2} = \int_{r_2}^{r_3} \frac{R_{shc}}{2\pi x}dx = \frac{R_{shc}}{2\pi}\ln\left(\frac{r_3}{r_2}\right),$$

$$R_{B2} = \int_{r'_2}^{r'_3} \frac{R_{shc}}{2\pi x}dx = \frac{R_{shc}}{2\pi}\ln\left(\frac{r'_3}{r'_2}\right).$$

3e) The resistance value $R_{A12}$ of the active area between the circular ohmic electrode A1 and the first annular ohmic electrode A2 in the first set of testing patterns, and the resistance value $R_{B12}$ of the active area between the circular ohmic electrode B1 and the first annular ohmic electrodes B2 in the second set of testing patterns are respectively calculated as follows:

$$R_{A12} = \int_{r_1}^{r_2} \frac{R_{sh}}{2\pi x}dx = \frac{R_{sh}}{2\pi}\ln\left(\frac{r_2}{r_1}\right),$$

$$R_{B12} = \int_{r_1}^{r'_2} \frac{R_{sh}}{2\pi x}dx = \frac{R_{sh}}{2\pi}\ln\left(\frac{r'_2}{r_1}\right).$$

3f) The active area resistance $R_{A23}$ between the first circular ohmic electrode A2 and the second annular ohmic electrode A3 in the first set of testing patterns, and the active area resistance $R_{B23}$ between the first annular ohmic electrode B2 and the second annular ohmic electrode B3 in the second set of testing patterns are respectively calculated as follows:

$$R_{A23} = \int_{r_3}^{r_4} \frac{R_{sh}}{2\pi x}dx = \frac{R_{sh}}{2\pi}\ln\left(\frac{r_4}{r_3}\right),$$

$$R_{B23} = \int_{r'_3}^{r_4} \frac{R_{sh}}{2\pi x}dx = \frac{R_{sh}}{2\pi}\ln\left(\frac{r_4}{r'_3}\right).$$

3g) The $R_{A2}$ formula in the step 3d), the $R_{A12}$ formula in the step 3e), and the $R_{A23}$ formula in the step 3f) are brought into the $R_{L1}$ formula in the step 3a), and the following formula is obtained:

$$R_{L1} = R_{A1} + \frac{R_{sh}}{2\pi}\ln\frac{r_2}{r_1} + \frac{R_{shc}}{2\pi}\ln\frac{r_3}{r_2} + \frac{R_{sh}}{2\pi}\ln\frac{r_4}{r_3} + R_{A3}.$$

3h) The $R_{B2}$ formula in the step 3d), the $R_{B12}$ formula in the step 3e), and the $R_{B23}$ formula in the step 3f) are brought into the $R_{L2}$ formula in the step 3c), and the following formula is obtained:

$$R_{L2} = R_{A1} + \frac{R_{sh}}{2\pi}\ln\frac{r'_2}{r'_1} + \frac{R_{shc}}{2\pi}\ln\frac{r'_3}{r'_2} + \frac{R_{sh}}{2\pi}\ln\frac{r_4}{r'_3} + R_{A3}.$$

3i) The difference between the $R_{L2}$ formula in step 3h) and the $R_{L1}$ formula in step 3g) is calculated, and the correction formula for calculating the sheet resistance $R_{shc}$ of the ohmic contact area is obtained:

$$R_{shc} = R_{sh} - \frac{2\pi(R_{L2} - R_{L1})}{\ln\frac{r'_2 r'_3}{r_2 r_3}},$$

wherein, $R_{shc}$ on the left side of the equal sign is the ohmic contact area sheet resistance to be solved, and the first term $R_{sh}$ on the right side of the equal sign is the active area resistance.

The value of $R_{sh}$ can be extracted by the conventional rectangular transmission line model TLM method, but is not limited to this method. The second term on the right side of the equal sign is defined as a correction term $\Delta$, i.e.:

$$\Delta = \frac{2\pi(R_{L2} - R_{L1})}{\ln\frac{r'_2 r'_3}{r_2 r_3}},$$

where $r_1 < r'_2 < r'_3 < r_4 < r_5$.

The sheet resistance $R_{shc}$ of the ohmic contact area can be accurately calculated by the above correction formula.

In the present embodiment, the step 103 can be performed by a computer readable storage medium having stored therein a computer program that, when executed by the processor, implements the above step 103.

Step 104: the performance of ohmic contact electrode in the semiconductor device is evaluated according to the ohmic contact area sheet resistance $R_{shc}$.

As mentioned above, the ohmic contact area resistance is an important indicator to judge the quality of the ohmic contact in semiconductor device, and the accurate test of the ohmic contact area resistance is the key to calculate the ohmic contact resistance. In general, if the ohmic contact area sheet resistance $R_{shc}$ is in the range of 0.5-1 Ω·mm, the ohmic contact electrodes in semiconductor device can be considered to perform well. Therefore, the performance of ohmic contact electrodes in the semiconductor device can be evaluated by the ohmic contact area sheet resistance, and then the process optimization, performance evaluation, and reliability analysis can be performed on the fabricated semiconductor device.

In another embodiment of the present application, a method for testing and correcting a sheet resistance of an ohmic contact area includes the following steps.

Step 1: ohmic contact area sheet resistance testing patterns are fabricated on a semiconductor having a non-heterojunction structure.

Figure 6:
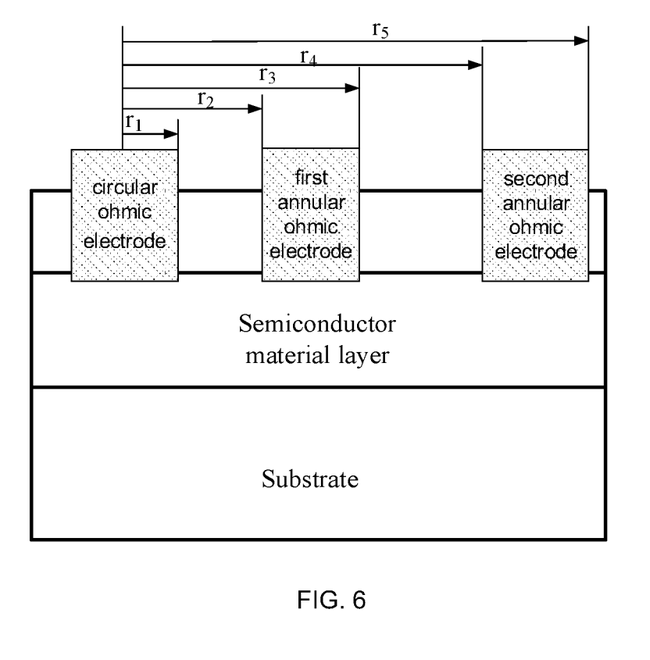
FIG. 6 is a schematic structural view showing a set of testing patterns on a non-heterojunction structure according to an embodiment of the present disclosure.

1a) A substrate layer and a semiconductor material layer are sequentially grown on a substrate using an epitaxial growth technique, wherein a commonly used substrate is sapphire, silicon, silicon carbide, diamond material, and a common semiconductor material layer may be a compound consisting III-V material such as GaN, GaAs or AlGaN, or a Si, $GaO_2$ material or the like. FIG. 6 shows a schematic structure of testing patterns for testing a sheet resistance of an ohmic contact area on a non-heterojunction structure.

1b) Two sets of circular ohmic contact testing patterns are formed on the semiconductor material layer by DC magnetron sputtering, optical lithography and stripping or ion implantation, and then high temperature annealing, wherein a first set of circular testing patterns is also as shown in FIG. 3, and a second set of circular testing patterns is also as shown in FIG. 4.

Referring to FIG. 3, the first set of circular testing patterns includes three different ohmic electrodes: one circular ohmic electrode A1 and two concentric annular ohmic electrodes, namely a first annular ohmic electrode A2 and a second annular ohmic electrode A3 respectively. The length of each ohmic electrode is reasonably set by a tester according to the usual length range and test requirements in the metal electrode deposition process. The example is provided, but not limited to that a radius of the circular ohmic electrode A1 in the first set of circular testing patterns is $r_1=90$ μm, an inner diameter of the first annular ohmic electrode A2 is $r_2=100$ μm, an outer diameter of the first annular ohmic electrode A2 is $r_3=130$ μm; an inner diameter of the second annular ohmic electrode A3 is $r_4=140$ and an outer diameter the second annular ohmic electrode A3 is $r_5=160$ μm.

Referring to FIG. 4, the second set of circular testing patterns includes three different ohmic electrodes: one circular ohmic electrode B1 and two concentric annular ohmic electrodes, namely a first annular ohmic electrode B2 and a second annular ohmic electrode B3 respectively. The length of each ohmic electrode is reasonably set by a tester according to the usual length range and test requirements in the metal electrode deposition process. The example is provided, but not limited to that a radius of the circular ohmic electrode B1 in the second set of circular testing patterns is $r_1=90$ an inner diameter of the first annular ohmic electrode B2 is $r'_2=95$ an outer diameter of the first annular ohmic electrode B2 is $r_3=135$ an inner diameter of the second annular ohmic electrode B3 is $r_4=140$ μm, and an outer diameter of the second annular ohmic electrode B3 is $r_5=160$ μm.

Step 2: a total resistance of the first set and the second set of circular testing patterns are measured respectively.

Referring to the resistance testing schematic diagram of FIG. 5, testing steps of the total resistance between the circular ohmic electrode and the second annular ohmic electrode of each set of testing patterns are as follows.

2a) A bias voltage $V_1$ is applied between the circular ohmic electrode A1 and the second annular ohmic electrode A3 of the first set of circular testing patterns, and a current meter is series connected in the loop. Then a value of the ammeter $I_1$ is read, and a total resistance value $R_{L1}$ between the test circular ohmic electrode A1 and the second circular ohmic electrode A3 is calculated using the Ohm's law:

$R_{L1}=V_1/I_1$.

2b) A bias voltage $V_2$ is applied between the circular ohmic electrode B1 and the second annular ohmic electrode B3 of the second set of circular testing patterns, and a current meter is series connected in the loop. Then a value of the ammeter $I_2$ is read, and a total resistance value $R_{L2}$ between the test circular ohmic electrode B1 and the second circular ohmic electrode B3 is Calculated using the Ohm's law:

$R_{L2}=V_2/I_2$.

Step 3: a correction formula of the ohmic contact area sheet resistance $R_{shc}$ in the testing patterns is constructed.

3a) Taking the testing patterns in the present disclosure as an example, according to FIG. 3, the resistance value $R_{L1}$ between the circular ohmic electrode A1 and the second annular ohmic electrode A3 in the first set of circular testing patterns is expressed as:

$R_{L1}=R_{A1}+R_{A12}+R_{A2}+R_{A23}+R_{A3}$;

wherein, $R_{A1}$ is a resistance value of the ohmic contact area of the circular ohmic electrode A1 in the first set of circular testing patterns; $R_{A12}$ is a resistance value of the active area between the circular ohmic electrode A1 and the first annular ohmic electrode A2 in the first set of circular testing patterns; resistance value of the ohmic contact area of the first annular ohmic electrode A2 in the first set of circular testing patterns; $R_{A23}$ is a resistance value of the active area between the first annular ohmic electrode A2 and the second annular ohmic electrode A3 in the first set of circular testing patterns, and $R_{A3}$ is a resistance value of the ohmic contact area under the second annular ohmic electrode A3 in the first set of circular testing patterns.

3b) Taking the testing patterns in the present disclosure as an example, according to FIG. 4, the resistance value $R_{L2}$ between the circular ohmic electrode B1 and the second annular ohmic electrode B3 in the second set of circular testing patterns is expressed as:

$R_{L2}=R_{B1}+R_{B12}+R_{B2}+R_{B23}+R_{B3}$ wherein, $R_{B1}$ is a resistance value of the ohmic contact area of the circular ohmic electrode B1 in the second set of circular testing patterns; $R_{B12}$ is a resistance value of the active area between the circular ohmic electrode B1 and the first annular ohmic electrode B2 in the second set of circular testing patterns; $R_{B2}$ is a resistance of the ohmic contact area of the first annular ohmic electrode B2 in the second set of circular testing patterns; $R_{B23}$ is a resistance value of the active area between the first annular ohmic electrode B2 and the second annular ohmic electrode B3 in the second set of circular testing patterns; $R_{B3}$ is a resistance value of the ohmic contact area of the second annular ohmic electrode B3 in the second set of circular testing patterns.

3c) According to the relationships that the circular ohmic electrode A1 of the first set of testing patterns and the circular ohmic electrode B1 of the second set of testing patterns have the same radius, and the second annular ohmic electrodes A3 and B3 have the same radius, the resistance relationship of each part in the two sets of ohmic contact testing patterns are obtained: $R_{A1}=R_{B1}$, $R_{A3}=R_{B3}$, and then the expression of the resistance value $R_{L2}$ between the circular ohmic electrode B1 and the second annular ohmic electrode B3 of the second set of ohmic contact testing patterns in step 3b) is transformed into:

$R_{L2}=R_{A1}+R_{B12}+R_{B2}+R_{B23}+R_{A3}$

3d) The resistance value $R_{A2}$ of the contact area under the first annular ring ohmic electrode A2 in the first set of ohmic contact testing patterns and the resistance value $R_{B2}$ of contact area under the first annular ohmic electrode B2 in the second set of ohmic contact testing patterns are respectively calculated as follows:

$$R_{A2} = \int_{r_2}^{r_3} \frac{R_{shc}}{2\pi x} dx = \frac{R_{shc}}{2\pi} \ln\left(\frac{r_3}{r_2}\right),$$

$$R_{B2} = \int_{r'_2}^{r'_3} \frac{R_{shc}}{2\pi x} dx = \frac{R_{shc}}{2\pi} \ln\left(\frac{r'_3}{r'_2}\right).$$

3e) The active area resistance value $R_{A12}$ between the circular ohmic electrode A1 and the first annular ohmic electrode A2 in the first set of testing patterns, and the resistance value $R_{B12}$ of the active area between the circular ohmic electrode B1 and the first annular ohmic electrodes B2 in the second set of testing patterns are respectively calculated as follows:

$$R_{A12} = \int_{r_1}^{r_2} \frac{R_{sh}}{2\pi x} dx = \frac{R_{sh}}{2\pi} \ln\left(\frac{r_2}{r_1}\right),$$

$$R_{B12} = \int_{r_1}^{r'_2} \frac{R_{sh}}{2\pi x} dx = \frac{R_{sh}}{2\pi} \ln\left(\frac{r'_2}{r_1}\right).$$

3f) The active area resistance $R_{A23}$ between the first circular ohmic electrode A2 and the second annular ohmic electrode A3 in the first set of testing patterns, and the active area resistance $R_{B23}$ between the first annular ohmic electrode B2 and the second annular ohmic electrode B3 in the second set of testing patterns are respectively calculated as follows:

$$R_{A23} = \int_{r_3}^{r_4} \frac{R_{sh}}{2\pi x} dx = \frac{R_{sh}}{2\pi} \ln\left(\frac{r_4}{r_3}\right),$$

$$R_{B23} = \int_{r'_3}^{r_4} \frac{R_{sh}}{2\pi x} dx = \frac{R_{sh}}{2\pi} \ln\left(\frac{r_4}{r'_3}\right).$$

3g) The $R_{A2}$ formula in the step 3d), the $R_{A12}$ formula in the step 3e), and the $R_{A23}$ formula in the step 3f) are brought into the $R_{L1}$ formula in the step 3a), and the following formula is obtained:

$$R_{L1} = R_{A1} + \frac{R_{sh}}{2\pi} \ln\frac{r_2}{r_1} + \frac{R_{shc}}{2\pi} \ln\frac{r_3}{r_2} + \frac{R_{sh}}{2\pi} \ln\frac{r_4}{r_3} + R_{A3}.$$

3h) The $R_{B2}$ formula in the step 3d), the $R_{B12}$ formula in the step 3e), and the $R_{B23}$ formula in the step 3f) are brought into the $R_{L2}$ formula in the step 3c), and the following formula is obtained:

$$R_{L2} = R_{A1} + \frac{R_{sh}}{2\pi} \ln\frac{r'_2}{r'_1} + \frac{R_{shc}}{2\pi} \ln\frac{r'_3}{r'_2} + \frac{R_{sh}}{2\pi} \ln\frac{r_4}{r'_3} + R_{A3}.$$

3i) The difference between the $R_{L2}$ formula in step 3h) and the $R_{L1}$ formula in step 3g) is calculated, and a formula for calculating the sheet resistance $R_{shc}$ of the ohmic contact area is obtained:

$$R_{shc} = R_{sh} - \frac{2\pi(R_{L2} - R_{L1})}{\ln\frac{r'_2 r'_3}{r_2 r_3}},$$

wherein, $R_{shc}$ on the left side of the equal sign is the ohmic contact area sheet resistance to be solved, and the first term $R_{sh}$ on the right side of the equal sign is the active area resistance. The value of $R_{sh}$ can be extracted by the conventional rectangular transmission line model TLM method, but is not limited to this method.

The second term on the right side of the equal sign is defined as a correction term $\Delta$, i.e.:

$$\Delta = \frac{2\pi(R_{L2} - R_{L1})}{\ln\frac{r'_2 r'_3}{r_2 r_3}},$$

wherein $r_1 < r'_2 < r'_3 < r_4 < r_5$.

Step 4: the performance of ohmic contact electrode in the semiconductor device is evaluated according to the ohmic contact area sheet resistance $R_{shc}$.

The performance of ohmic contact electrode in the semiconductor device can be evaluated by the ohmic contact electrode sheet resistance, and then the process optimization, performance evaluation, and reliability analysis can be performed on the fabricated semiconductor device.

The above method can be used to quickly and accurately calculate the ohmic contact area sheet resistance $R_{shc}$, thereby more accurately evaluating the performance of the ohmic contact electrode. The method solves the problem that the ohmic contact resistance test is difficult and the test result precision is not high from the viewpoints of the device process and the simplified mathematical operation, and the applicable object can be various devices including the ohmic contact area.

The above is only the preferred embodiment of the present disclosure, and is not intended to limit the present disclosure. It is obvious to those skilled in the art that after understanding the content and principles of the present disclosure, modifications, equivalent substitutions and improvements may be made within the spirit and scope of the disclosure. For example, the testing patterns used in the present disclosure are based on a HEMT device fabricated from III-V semiconductor materials such as GaN or GaAs, and are also applicable to a semiconductor materials or devices such as field effect transistors and film material. These modifications, equivalent substitutions and improvements are intended to be included within the scope of the present disclosure.

What is claimed is:

1. A method for characterizing ohmic contact electrode performance of a semiconductor device, comprising:
   preparing two sets of testing patterns on a semiconductor device waited to be evaluated;
   testing resistance values of the two sets of testing patterns respectively;
   calculating a sheet resistance of an ohmic contact area according to the obtained resistance values; and
   evaluating the ohmic contact electrode performance of the semiconductor device according to the sheet resistance of the ohmic contact area;
   wherein preparing two sets of testing patterns on a semiconductor device waited to be evaluated comprises:

preparing the two sets of testing patterns on a semiconductor material of the semiconductor device for measuring the sheet resistance of the ohmic contact area, wherein the two sets of testing patterns comprise:
  a first set of testing patterns, comprising a central contacted circular ohmic electrode A1, a concentric first annular ohmic electrode A2, and a concentric second annular ohmic electrode A3; and
  a second set of testing patterns, comprising a central contacted circular ohmic electrode B1, a concentric first annular ohmic electrode B2, and a concentric second annular ohmic electrode B3;
wherein the circular ohmic electrode A1 has the same radius as the circular ohmic electrode B1, and the second annular ohmic electrode A3 has the same radius as the second annular ohmic electrode B3;
wherein testing resistance values of the two sets of testing patterns respectively comprises:
  measuring a resistance value $R_{L1}$ between the circular ohmic electrode A1 and the second annular ohmic electrode A3 by a semiconductor parameter analyzer; and
  measuring a resistance value $R_{L2}$ between the circular ohmic electrode B1 and the second annular ohmic electrode B3 by the semiconductor parameter analyzer;
wherein calculating a sheet resistance of an ohmic contact area according to the obtained resistance values comprises:
  constructing a correction formula for correcting the sheet resistance of the ohmic contact area according to the resistance value $R_{L1}$ and the resistance value $R_{L2}$, wherein the correction formula is represented as:

$$R_{shc} = R_{sh} - \frac{2\pi(R_{L2} - R_{L1})}{\ln\frac{r'_2 r'_3}{r_2 r_3}},$$

where $R_{shc}$ refers to the sheet resistance of the ohmic contact area to be solved, $R_{sh}$ refers to an active area resistance; $r_2$ and $r_3$ respectively refer to an inner radius and an outer radius of the first annular ohmic electrode A2; $r'_2$ and $r'_3$ respectively refer to an inner radius and an outer radius of the first annular ohmic electrode B2.

2. The method for characterizing ohmic contact electrode performance of a semiconductor device according to claim 1, wherein the two sets of testing patterns are prepared by depositing metal electrodes or performing ion implantation on the semiconductor material, and then performing a high temperature annealing.

3. The method for characterizing ohmic contact electrode performance of the semiconductor device according to claim 1, wherein measuring a resistance value $R_{L1}$ between the circular ohmic electrode A1 and the second annular ohmic electrode A3 by a semiconductor parameter analyzer comprises:
  applying a bias voltage V1 between the circular ohmic electrode A1 and the second annular ohmic electrode A3 by the semiconductor parameter analyzer, connecting an ammeter between the circular ohmic electrode A1 and the second annular ohmic electrode A3, reading a value $I_1$ of the ammeter, and calculating the resistance value $R_{L1}$ between the circular ohmic electrode A1 and the second annular ohmic electrode A3 through the Ohm's law.

4. The method for characterizing ohmic contact electrode performance of a semiconductor device according to claim 1, wherein measuring a resistance value $R_{L2}$ between the circular ohmic electrode B1 and the second annular ohmic electrode B3 by the semiconductor parameter analyzer comprises:
  applying a bias voltage V2 between the circular ohmic electrode B1 and the second annular ohmic electrode B3 by the semiconductor parameter analyzer, connecting an ammeter between the circular ohmic electrode B1 and the second annular ohmic electrode B3, reading a value $I_2$ of the ammeter, and calculating the resistance value $R_{L2}$ between the circular ohmic electrode B1 and the second annular ohmic electrode B3 through the Ohm's law.

5. The method for characterizing ohmic contact electrode performance of the semiconductor device according to claim 1, wherein constructing a formula for correcting the sheet resistance of the ohmic contact area according to the resistance value $R_{L1}$ and the resistance value $R_{L2}$ comprises:
  expressing the resistance value $R_{L1}$ as a first expression of $R_{L1}$: $R_{L1}=R_{A1}+R_{A12}+R_{A2}+R_{A23}\pm R_{A3}$; where $R_{A1}$ refers to a resistance value of the ohmic contact area under the circular ohmic electrode A1, $R_{A12}$ refers to a resistance value of an active area between the circular ohmic electrode A1 and the first annular ohmic electrode A2, $R_{A2}$ refers to a resistance value of the ohmic contact area under the first annular ohmic electrode A2, $R_{A23}$ refers to a resistance value of an active area between the first annular ohmic electrode A2 and the second annular ohmic electrode A3, and $R_{A3}$ refers to a resistance value of the ohmic contact area under the second annular ohmic electrode A3;
  expressing the resistance value $R_{L2}$ as a first expression of $R_{L2}$: $R_{L2}=R_{B1}+R_{B12}+R_{B2}+R_{B23}+R_{B3}$; where $R_{B1}$ refers to a resistance value of the ohmic contact area under the circular ohmic electrode B1, $R_{B12}$ refers to a resistance value of an active area between the circular ohmic electrode B1 and the first annular ohmic electrode B2, $R_{B2}$ refers to a resistance value of the ohmic contact area under the first annular ohmic electrode B2, $R_{B23}$ refers to a resistance value of an active area between the first annular ohmic electrode B2 and the second annular ohmic electrode B3, and $R_{B3}$ refers to a resistance value of the ohmic contact area under the second annular ohmic electrode B3;
  obtaining a second expression of $R_{L2}$ from the first expression of $R_{L2}$ according to $R_{A1}=R_{B1}$ and $R_{A3}=R_{B3}$, the second expression of $R_{L2}$ being represented as $R_{L2}=R_{A1}+R_{B12}+R_{B2}+R_{B23}+R_{A3}$;
  calculating the resistance value $R_{A2}$ and the resistance value $R_{B2}$ respectively:

$$R_{A2} = \int_{r_2}^{r_3} \frac{R_{shc}}{2\pi x} dx = \frac{R_{shc}}{2\pi x} \ln\left(\frac{r_3}{r_2}\right),$$

$$R_{B2} = \int_{r'_2}^{r'_3} \frac{R_{shc}}{2\pi x} dx = \frac{R_{shc}}{2\pi x} \ln\left(\frac{r'_3}{r'_2}\right);$$

calculating the resistance value $R_{A12}$ and the resistance value $R_{B12}$ respectively:

$$R_{A12} = \int_{r_1}^{r_2} \frac{R_{sh}}{2\pi x} dx = \frac{R_{sh}}{2\pi} \ln\left(\frac{r_2}{r_1}\right),$$

$$R_{B12} = \int_{r_1'}^{r_2'} \frac{R_{sh}}{2\pi x} dx = \frac{R_{sh}}{2\pi} \ln\left(\frac{r_2'}{r_1'}\right);$$

calculating the resistance value $R_{A23}$ and the resistance value $R_{B23}$ respectively:

$$R_{A23} = \int_{r_3}^{r_4} \frac{R_{sh}}{2\pi x} dx = \frac{R_{sh}}{2\pi} \ln\left(\frac{r_4}{r_3}\right),$$

$$R_{B23} = \int_{r_3'}^{r_4} \frac{R_{sh}}{2\pi x} dx = \frac{R_{sh}}{2\pi} \ln\left(\frac{r_4}{r_3'}\right);$$

substituting the expressions of $R_{A2}$, $R_{A12}$, and $R_{A23}$ into the first expression of $R_{L1}$, and obtaining a second expression of $R_{L1}$ as follows:

$$R_{L1} = R_{A1} + \frac{R_{sh}}{2\pi} \ln\frac{r_2}{r_1} + \frac{R_{shc}}{2\pi} \ln\frac{r_3}{r_2} + \frac{R_{sh}}{2\pi} \ln\frac{r_4}{r_3} + R_{A3};$$

substituting the expressions of $R_{B2}$, $R_{B12}$, and $R_{B23}$ into the first expression of $R_{L2}$, and obtaining a third expression of $R_{L2}$ as follows:

$$R_{L2} = R_{A1} + \frac{R_{sh}}{2\pi} \ln\frac{r_2'}{r_1'} + \frac{R_{shc}}{2\pi} \ln\frac{r_3'}{r_2'} + \frac{R_{sh}}{2\pi} \ln\frac{r_4}{r_3'} + R_{A3};$$

and obtaining the correction formula by subtracting the second expression of RD from the third expression of $R_{L2}$;

where $r_1$ refers to a radius of the circular ohmic electrode A1 or a radius of the circular ohmic electrode B1, $r_4$ refers to an inner radius of the second annular ohmic electrode A3 or an inner radius of the second annular ohmic electrode B3.

* * * * *